United States Patent
Park et al.

(12) 
(10) Patent No.: US 6,333,219 B1
(45) Date of Patent: Dec. 25, 2001

(54) METHOD FOR FORMING A POLYSILICON NODE IN A SEMICONDUCTOR DEVICE

(75) Inventors: Wan-jae Park, Suwon; Gyung-jin Min, Seoul; Jeong-sic Jeon, Hwasung-gun, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/851,091

(22) Filed: May 9, 2001

(30) Foreign Application Priority Data

Oct. 27, 2000 (KR) .................................................. 00-63438

(51) Int. Cl.[7] .............................................. H01L 21/8242
(52) U.S. Cl. .......................... 438/238; 438/253; 438/672; 438/647; 438/629
(58) Field of Search ..................................... 438/238–241, 438/253–256, 396–399, 381, 672, 675, 629, 647

(56) References Cited

U.S. PATENT DOCUMENTS 6,271,117 * 8/2001 Cherng ................................. 438/624

\* cited by examiner

*Primary Examiner*—Jey Tsai
(74) *Attorney, Agent, or Firm*—Volentine Francos, PLLC

(57) ABSTRACT

A self-aligned contact hole is formed in a cell area of a semiconductor device, and then a polysilicon layer is formed on both the cell area and a peripheral circuit area. A first etch back process is performed using a reactant etching gas, such as $Cl_2$ gas, having a high etching rate with respect to the polysilicon layer. This first etch back process on the polysilicon layer is stopped before exposing the top surface of a capping layer in the peripheral circuit area, thereby leaving a thin polysilicon film on the capping layer. A second etch back process is then performed to form a polysilicon node filling the self-aligned contact hole in the cell area. In the second etch back process, an etching reactant gas, such as HBr gas, is used, which has a high etching selectivity of polysilicon with respect to the capping layer.

12 Claims, 3 Drawing Sheets

METHOD FOR FORMING A POLYSILICON NODE IN A SEMICONDUCTOR DEVICE

BACKGROUND OF THE INVENTION

1. Field of the Invention

The present invention relates to a method for manufacturing a semiconductor device having a cell area and a peripheral circuit area, and more particularly, to a method for manufacturing a semiconductor device in which a polysilicon node is formed in a cell area without decreasing the thickness of a gate electrode capping layer formed in a peripheral circuit area.

2. Description of the Related Art

Due to the increased integration density of semiconductor devices having a cell area and a peripheral circuit area, conventional photo-lithographic methods have come to exhibit certain shortcomings. For example, fabrication limitations arise when forming contact holes for a bit line connection plug, which connects an active area (such as a source and a drain) with bit lines. Limitations also arise when forming a storage electrode connection plug, which connects an active area and a storage electrode of a capacitor.

In forming a contact hole, an interlayer insulating layer (e.g., an oxide layer) covers a gate electrode structure, including a spacer formed on a side wall of a gate electrode, and a capping layer formed on the top surface of the gate electrode. The spacer and capping layer are formed of a substance (e.g., nitride) which has a high etching selectivity with respect to the oxide layer.

Active areas between two adjacent spacers are exposed through a self-aligned process. In forming a self-aligned contact hole, an etching process is performed with a peripheral circuit area being masked by a contact-type self-aligned photoresist mask pattern, which exposes a portion of a cell area where the contact hole will be formed. If the contact-type self-aligned photoresist mask pattern is misaligned, a bridging phenomenon may occur in which a bit line contacts other adjacent bit lines, eventually resulting in a short-circuit between the bit lines and a gate electrode under the bit lines. In an attempt to overcome this problem, the contact-type self-aligned photoresist mask pattern may be replaced with a line-type photoresist mask pattern. The line-type photoresist mask pattern exposes an area where a contact hole will be formed and a gate electrode placed on both sides of the area is used.

The contact hole, formed by the line-type photoresist mask pattern, exposes the active area between gate electrodes in the cell area. The photoresist mask pattern is then removed. During this process, the capping layer in the cell area is damaged or reduced in thickness to a depth of 600–700 Å.

After a polysilicon layer is formed on the entire surface of the cell area and the peripheral area, a polysilicon node of a cell is formed of chemical mechanical polishing (CMP). During the CMP process, the capping layers in the cell area and the peripheral area are additionally damaged to depths of about 200 Å and 400–600 Å, respectively.

The decrease in thickness of the capping layer is undesirable and reduces the reliability of the semiconductor devices. During the process for forming self-aligned holes in a peripheral area, the possibility arises of a short circuit between a gate electrode and a bit line connection plug or an interconnection connection plug, or between a gate electrode and a bit line or an interconnection.

SUMMARY OF THE INVENTION

If is an object of the present invention to provide a method of forming a bit line connection plug and a storage electrode connection plug node of a cell area, without decreasing the thickness of a capping layer formed in a peripheral area.

Accordingly, to achieve the above and other objects of the invention, the present invention provides a method of forming a semiconductor device in which a peripheral circuit area of the device is first masked. A self-aligned contact hole is then formed in a cell area of the device, using a capping layer formed on the upper part of a gate electrode formed in the cell area, and a spacer formed along the side walls of the gate electrode. Next, a polysilicon layer is formed on the entire surface of the cell area and the peripheral circuit area. This polysilicon layer is etched twice. A first etch back process is performed using a reactant etching gas having a high etching rate with respect to the polysilicon layer (e.g., a reactant etching gas including $Cl_2$ gas). The first etch back process on the polysilicon layer is stopped before exposing the top surface of the capping layer in the peripheral circuit area, thereby leaving a thin polysilicon film on the capping layer in the peripheral circuit area. Preferably, the first etch back process is stopped when the thickness of the thin polysilicon film remaining on the capping layer in the peripheral circuit area is about 1000 Å.

A second etch back process is performed on the entire surface of the polysilicon layer to form a polysilicon node filling a self-aligned contact hole in a cell area. In the second etch back process, an etching reactant gas (e.g., HBr gas) is used, which has a high etching selectivity of polysilicon with respect to the capping layer, and does not bring about a loading phenomenon.

In the first and second etch back processes, the polysilicon node is formed in the cell area and the thickness of the capping layer on the top part of the gate electrode in the peripheral circuit area does not decrease. Thus, when a self-aligned contact hole is formed in a peripheral circuit area, a short circuit between the gate electrode and a subsequently formed bit line is avoided.

BRIEF DESCRIPTION OF THE DRAWINGS

The above and other objects and features of the present invention will become more readily apparent from the detailed description that follows, with reference to the accompanying drawings, in which.

DETAILED DESCRIPTION OF THE PREFERRED EMBODIMENTS

Figure 1:
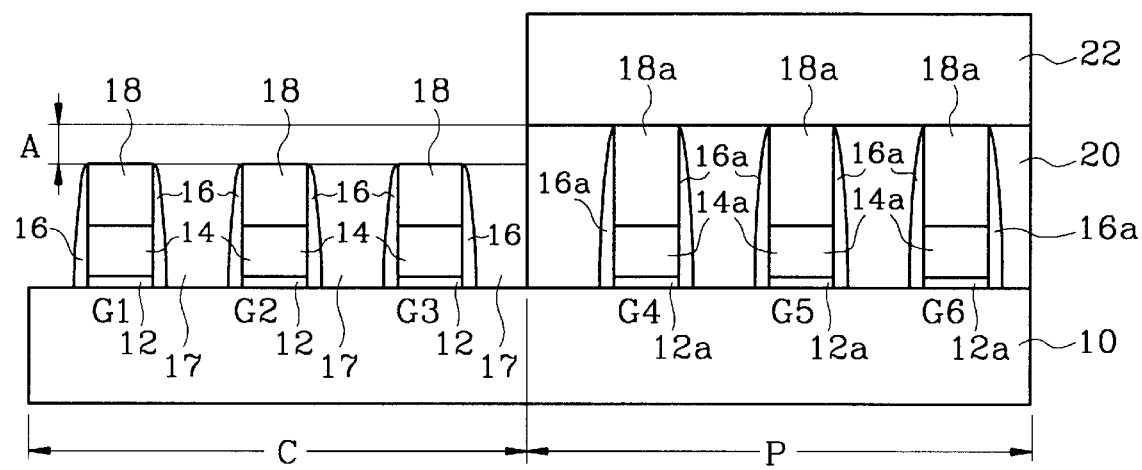
FIG. 1 shows a semiconductor device having a cell area and a peripheral circuit area, and a mask layer covering the peripheral circuit area.

In FIG. 1, gate electrode structures G1, G2, G3, G4, G5, and G6 are formed on a substrate 10 of a semiconductor device which includes a cell area C and a peripheral circuit area P.

Each of the gate electrode structures G1, G2 and G3 belonging to the cell area C includes a gate insulating layer 12, a gate electrode 14, a capping layer pattern 18 formed on the top surface of the gate electrode 14, and a pair of spacers 16 formed on the side walls of the gate electrode structures.

Each of the gate electrode structures G4, G5 and G6 belonging to the peripheral circuit area P includes a gate insulating layer 12a, a gate electrode 14a, a capping layer pattern 18a formed on the top surface of the gate electrode 14a, and a pair of spacers 16a formed on the side walls of the gate electrode structures.

After an interlayer insulating layer 20 is formed on the entire surface of the substrate 10 of a semiconductor device having the gate electrode structures G1, G2, G3, G4, G5, and G6 formed thereon, a mask 22 is formed over the peripheral circuit area P. A self-aligned contact hole 17 is formed in the cell area C by relying on the etching selectivity of the capping layer 18 and the spacers 16 with respect to the interlayer insulating layer 20. The interlayer insulating layer 20 may, for example, be formed of silicon oxide, silicon nitride, silicon oxide nitride, borophospho silicate glass (BPSG), boro silicate glass (BSG), phospho silicate glass (PSG), undoped silicate glass (USG), tetraethylorthosilicate (TEOS), or plasma enhanced (PE)-TEOS. The capping layer 18 and the spacers 16 must be different than the interlayer insulating layer 20, and they may, for example, be formed of silicon nitride, aluminum oxide or titanium oxide.

In forming the self-aligned contact hole 17, the capping layer 18 in the cell area C will be damaged, so that the thickness of the capping layer in the cell area C decreases as shown in FIG. 1 by an amount "A" which is about 400–500 Å.

Figure 2:
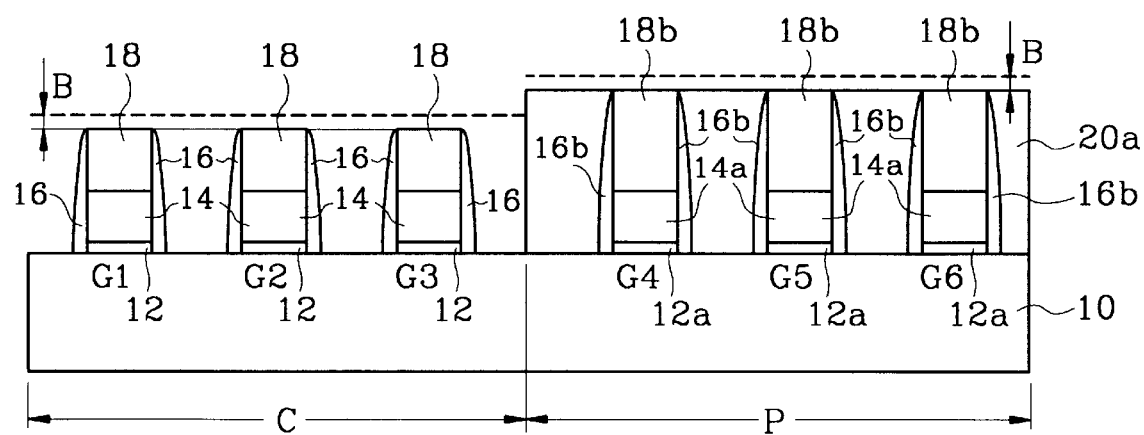
FIG. 2 shows the results of the removal of a mask layer from the structure of FIG. 1.

FIG. 2 shows the result of removal of the mask 22 illustrated in FIG. 1. After this process, the thicknesses of the cell area C and the peripheral circuit area P decrease by an amount "B", which is about 200 Å. More specifically, if the initial thickness of the capping layer 18 is 2000 Å, the thickness of the capping layer in the cell area C will be 1300 to 1400 Å after the processes of forming the self-aligned contact hole in the cell area C, and after removing the mask in the peripheral circuit area P. By contrast, the capping layer of the peripheral circuit area P will be 1800 Å thick after the two processes. In other words, there is a difference of 400–500 Å in the thicknesses of the capping layers of the cell area C and the peripheral circuit area P.

Figure 3:
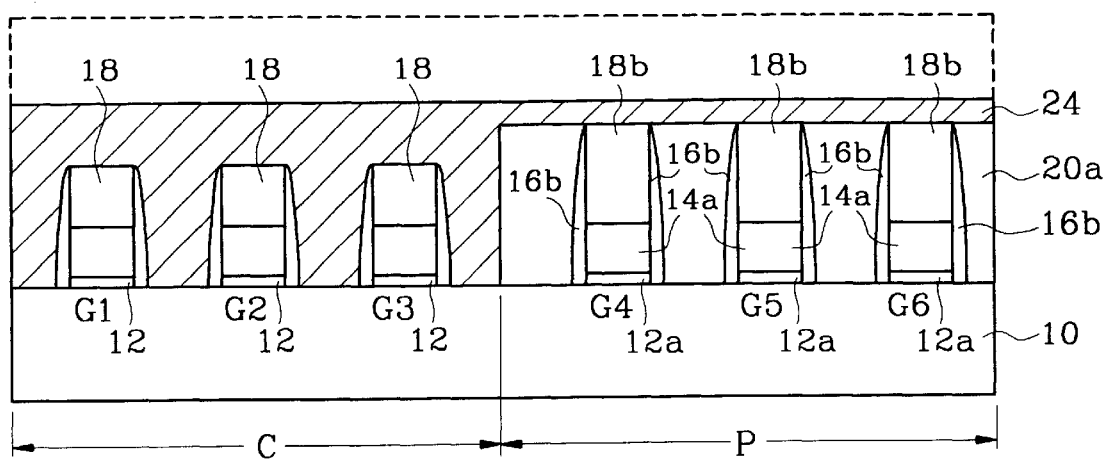
FIG. 3 shows the formation of a polysilicon layer on the structure of FIG. 2 and the results of a first etch back process.

In FIG. 3, a polysilicon layer having a thickness of about 5000 Å is formed on the entire surface of the semiconductor substrate 10 comprising the cell area C and the peripheral circuit area P. The thickness of the polysilicon layer initially covers the portion represented by the dotted lines in FIG. 3. Then, a first etch back process is performed on the entire surface of the polysilicon layer using a reactant gas having a high etching rate with respect to the polysilicon layer. For example, a reactant etching gas (e.g., an etching gas including $Cl_2$ gas) capable of etching the polysilicon layer at a rate of 2500 Å or more per minute is used. As shown in FIG. 3, the first etch back process is stopped before the capping layer 18b in the peripheral circuit area P is exposed. This leaves a thin polysilicon film 24 formed thereon, preferably with a thickness of about 1000 Å. If the etch back process were continued until a polysilicon node in the cell area C was created, the resultant loading phenomenon would make it impossible to form a polysilicon node with a uniform thickness.

Figure 4:
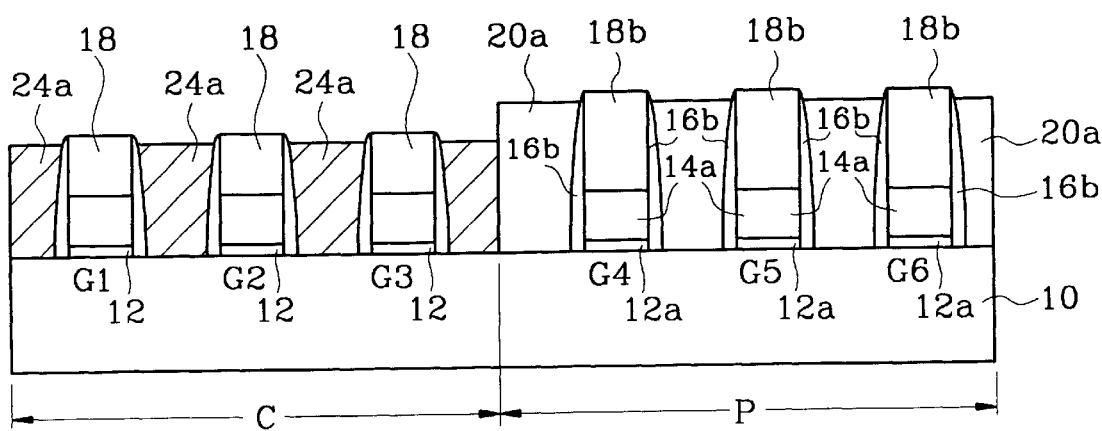
FIG. 4 shows the results of a second etch back process on the structure of FIG. 3.

Thus, to form a node 24a in the cell area C, a second etch back process is performed on the polysilicon layer as shown in FIG. 4. In the second etch back process, an etching reactant gas such as HBr is chosen, which has an etching selectivity ratio of the polysilicon layer to the capping layers 18 and 18a of at least 5. In this manner, the loading phenomenon does not occur. Here, the polysilicon layer in the peripheral circuit area P is removed as well and the thickness of an insulating layer 20a only slightly decreases.

Note that the capping layer pattern 18b is not substantially damaged. The capping layer in the peripheral circuit area P is damaged only by an amount of about 200 Å, while the thickness of the capping layer 18 in the cell area C decreases by an amount of 600–700 Å. With the previously described conventional technology, the thickness of the capping layer in the peripheral circuit area decreased by about 400 Å during the CMP process employed while forming a polysilicon node in the cell area C. However, in the present invention, a decrease in the thickness of the capping layer in the peripheral circuit area P can be controlled, because a two-step etch back process is performed, rather than a CMP process.

Figure 5:
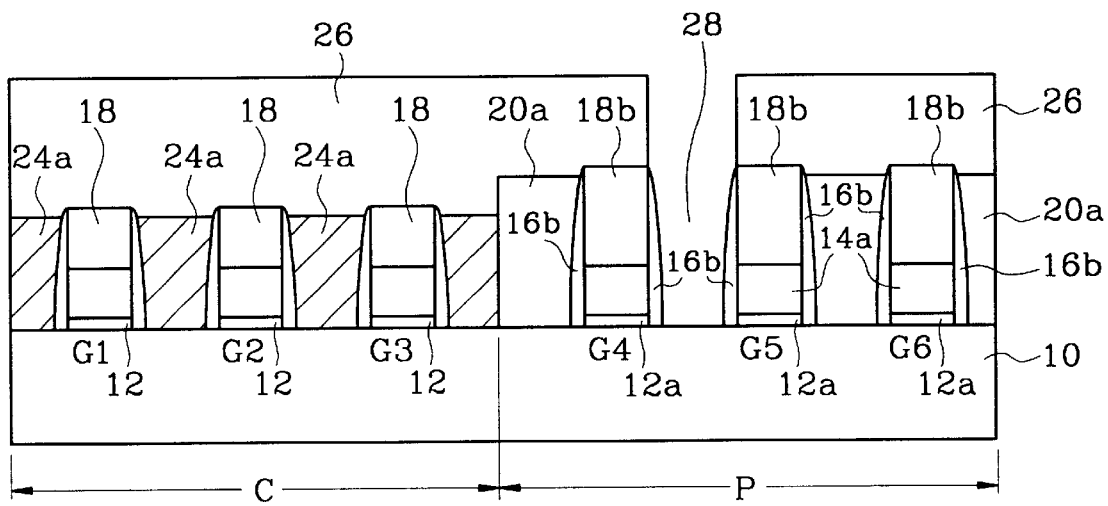
FIG. 5 shows formation of an interlayer insulating layer and a self-aligned contact hole in the structure of FIG. 4.

In FIG. 5, a second interlayer insulating layer 26 is formed over the surface of the semiconductor substrate 10 having the cell area C and the peripheral circuit area P, and a process of forming a self-aligned contact hole in the peripheral circuit area P is also performed. The process of forming a self-aligned contact hole 28 in the peripheral circuit area P is the same as the process of forming a self-aligned contact hole in the cell area C. In the process of forming the self-aligned contact hole 28 in the peripheral circuit area P, etching selectivity ratios of a first interlayer insulating layer 20a and second interlayer insulating layer 26 with respect to the capping layer 18b and the spacers 16b are used. Even if the mask pattern (not shown) is misaligned during the formation of the self-aligned contact hole 28 in the peripheral circuit area P, the surface of the gate electrode 14a under the capping layer 18a is not exposed.

Figure 6:
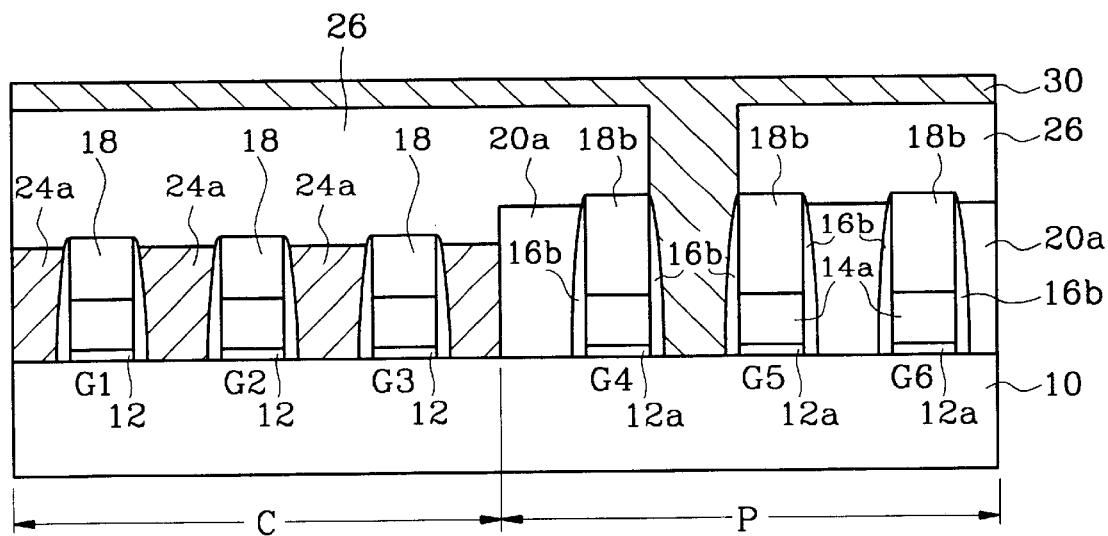
FIG. 6 shows formation of a conductive film on the structure of FIG. 5.

As shown in FIG. 6, the self-aligned contact hole in the peripheral circuit area P is filled with a conductive material and a conductive film 30 is formed on the surface of the second interlayer insulating layer 26. Later, a conductive plug node (not shown) is formed on the conductive film 30 by mechanical and chemical polishing processes. The conductive plug node connects an active area exposed by the self-aligned contact hole to a subsequently formed bit line or an interconnection.

To summarize, in the present invention, a polysilicon layer is partially etched back using an etching reactant gas having a high etching selectivity ratio of the polysilicon layer to the entire surface of a semiconductor substrate 10. Then the polysilicon layer is etched back again in a second process using another reactant gas. The second reactant gas (e.g., HBr) is characterized in that a loading phenomenon is avoided, and the etching selectivity ratio of the polysilicon to the capping layer and spacers is at least 5. Accordingly, even if the mask used for forming a self-aligned contact hole is misaligned, a short circuit between a gate electrode in a peripheral circuit area and bit lines or interconnections may be prevented. This is because the capping layer pattern in the peripheral circuit area is only slightly damaged during the formation of a polysilicon node in a cell area.

The invention is not restricted to the above particular embodiment, and it will be apparent to one of ordinary skill in the art that modifications to the described embodiment may be made without departing from the spirit and scope of the invention.

What is claimed is:

1. A method for manufacturing a semiconductor device, comprising:

forming a plurality of gate electrode structures on each of a cell area and a peripheral circuit area of a semiconductor substrate, wherein each of the plurality of gate electrode structures includes a capping layer stacked over a gate electrode, and spacers on respective opposite side walls of the gate electrode and the capping layer;

forming an insulating layer on the cell area and the peripheral circuit area of the semiconductor substrate including the plurality of gate electrode structures;

forming a self-aligned contact hole in the cell area to obtain a resultant structure, wherein the self-aligned contact hole is formed by removing a portion of the insulating layer which is contained in the cell area so as to expose a surface portion of the semiconductor substrate between adjacent spacers of respective adjacent gate electrode structures;

forming a polysilicon layer over the cell area and the peripheral circuit area of the resultant structure;

conducting a first etch back process of the polysilicon layer using a first etching reactant gas, and ceasing the first etch back process prior to exposing the capping layer of the gate electrode structures in the peripheral circuit area such that a portion of the polysilicon layer remains over the cell area and the peripheral circuit area; and conducting a second etch back process on the portion of the polysilicon layer using a second etching reactant gas so as to expose the capping layer of the gate electrode structures in the cell area and the peripheral circuit area and to obtain a polysilicon node which fills the self-aligned contact hole in the cell area, wherein an etching rate of the polysilicon layer is higher for the first etching reactant gas than for the second etching reactant gas, and wherein an etch selectivity ratio of the polysilicon layer to the capping layer is higher for the second etching reactant gas than for the first etching reactant gas.

2. The method of claim 1, wherein a thickness of the portion of the polysilicon film in the peripheral circuit area is about 1000 Å.

3. The method of claim 1, wherein the spacers and the capping layer are comprised of a material selected from the group consisting of silicon nitride, aluminum oxide and titanium oxide.

4. The method of claim 3, wherein a material of the insulating layer is different than respective materials of the spacers and the capping layer of each of the gate electrode structures.

5. The method of claim 4, wherein the insulating layer is comprised of a material selected from the group consisting of silicon nitride, borophospho silicate glass (BPSG), boro silicate glass (BSG), phospho silicate glass (PSG), undoped silicate glass(USG), tetraethylorthosilicate (TEOS), and plasma enhanced-tetraethylorthosilicate (PE-TEOS).

6. The method of claim 1, wherein the first etching reactant gas includes $Cl_2$ gas.

7. The method of claim 1, wherein the second etching reactant gas includes HBr gas.

8. The method of claim 6, wherein the second etching reactant gas includes HBr gas.

9. The method of claim 1, wherein the etch selectivity ratio of the polysilicon layer to the capping layer for the second etching reactant gas is at least 5.

10. The method of claim 1, wherein the etching rate of the polysilicon layer for the first etching reactant gas is at least 2500 Å per minute.

11. The method of claim 9, wherein the etching rate of the polysilicon layer for the first etching reactant gas is at least 2500 Å per minute.

12. The method of claim 1, further comprising:

forming a second planarized insulating layer over the cell area and the peripheral circuit area after the second etch back process;

forming a second self-aligned contact hole which extends through the first and second insulating layers in the peripheral circuit area so as to expose a second surface portion of the semiconductor substrate between adjacent spacers of respective adjacent gate electrode structures of the peripheral circuit area; and forming a conductive layer within the second self-aligned contact hole.

* * * * *